(12) United States Patent
Fiorillo et al.

(10) Patent No.: US 6,363,626 B1
(45) Date of Patent: Apr. 2, 2002

(54) METHOD AND DEVICE FOR TREATING ITEMS STORED IN CONTAINERS AND STORAGE APPARATUS EQUIPPED WITH SUCH A DEVICE

(75) Inventors: Denis Fiorillo; Benjamin Jurcik; Sébastien Charles, all of Paris Cedex (FR)

(73) Assignee: L'Air Liquide Societe Anonyme pour l'Etude et l'Exploitation des Procedes Georges Claude, Paris (FR)

( * ) Notice: Subject to any disclaimer, the term of this patent is extended or adjusted under 35 U.S.C. 154(b) by 0 days.

(21) Appl. No.: 09/533,695

(22) Filed: Mar. 23, 2000

(30) Foreign Application Priority Data

Apr. 1, 1999 (FR) .............................................. 99 04092

(51) Int. Cl.[7] ................................................. F26B 21/12

(52) U.S. Cl. ........................................... 34/210; 34/84

(58) Field of Search ............................ 34/92, 492, 83, 34/84, 210, 230; 414/939

(56) References Cited

U.S. PATENT DOCUMENTS

| 4,595,344 A | * | 6/1986 | Briley ........................ 417/185 |
| 5,789,309 A | * | 8/1998 | Hellwig ..................... 438/478 |
| 5,797,195 A | * | 8/1998 | Huling et al. ................. 34/404 |
| 6,050,287 A | * | 4/2000 | Goshima et al. ............ 137/240 |
| 6,113,984 A | * | 9/2000 | MacLeish et al. ..... 427/255.32 |

* cited by examiner

Primary Examiner—Ira S. Lazarus
Assistant Examiner—Greg T. Warder
(74) Attorney, Agent, or Firm—Burns, Doane, Swecker & Mathis, L.L.P.

(57) ABSTRACT

This device for treating items stored in at least one container (12), comprises means (14) for supplying the containers with a treatment gas and means (16) for continuously purging the containers, the supply means being equipped with means (22) for regulating the pressure of the treatment gas upstream of the containers. The purging means comprise a gas ejector (28) connected to the outlet of the containers (12) and supplied with a drive gas so as to regulate the pressure of the treatment gas downstream of the containers (12) and thus control the flow rate of the treatment gas therein.

16 Claims, 3 Drawing Sheets

METHOD AND DEVICE FOR TREATING ITEMS STORED IN CONTAINERS AND STORAGE APPARATUS EQUIPPED WITH SUCH A DEVICE

This application claims priority under 35 U.S.C. §§119 and/or 365 to 99 04092 filed in France on Apr. 1, 1999; the entire content of which is hereby incorporated by reference.

BACKGROUND OF THE INVENTION

1. Field of the Invention

The present invention relates to a device and to a method for treating items stored in one or more containers, particularly suited to the treatment o silicon wafers placed in storage containers.

It also relates to an apparatus for storing silicon wafers using such a device.

2. Description of the Related Art

Silicon wafers are often stored in containers while they are awaiting production cycles, so as to reduce the effects of molecular contamination of atmospheric origin.

To reduce or eliminate the formation of oxides which is initiated by the presence of water or oxygen molecules near the surface of the wafer, it is known practice for the interior volume of the containers to be inerted by causing a stream of treatment gas, for example nitrogen, to flow through them.

Using this technique, it is necessary to precisely control the flow rate of the treatment gas in the containers, and the pressure of this gas, firstly to effectively eliminate the formation of oxides, and secondly to avoid damage to the containers as this would be likely to contaminate the wafers in so far as the wafers are not designed to withstand pressure variations more than a few tens of millibars relative to atmospheric pressure (both over and underpressure).

There are known, in the prior art, devices for treating items stored in containers, of the type comprising means for supplying the containers with a treatment gas and means for continuously purging the containers, the supply means being equipped with means for regulating the pressure of the treatment gas upstream of the containers.

In this type of device, the flow rate is regulated using mass flow rate controllers based on semiconductor technology. This therefore has rather mediocre reliability in so far as these drift quite often and are liable to exhibit operating faults due to failures of an electrical nature.

Furthermore, such devices are relatively expensive.

SUMMARY OF THE INVENTION

The object of the invention is to alleviate these drawbacks and provide a device for treating items which is capable of reliably controlling the flow rate and pressure of the treatment gas in the containers and do so at a relatively low cost.

The subject of the invention is therefore a device of the aforementioned type for treating items, which is characterized in that the purging means comprise a gas ejector connected to the outlet of the containers and supplied with a drive gas so as to regulate the pressure of the treatment gas downstream of the containers and thus control the flow rate of the treatment gas therein.

Thus, the elements used to regulate the flow rate and the pressure of the treatment gas consist of mechanical elements. The flow rate and pressure are therefore controlled with greater reliability.

The device for treating items according to the invention may further have one or more of the following features, taken in isolation or in any technically feasible combination:

the gas ejector constitutes a means for diluting the treatment gas, the flow rate of drive gas constituting a means of controlling the treatment gas content of the gas mixture leaving the ejector;

the ejector comprises two coaxial nozzles—an internal one and an external one—supplied respectively with drive gas and with treatment gas, the ratio of the passage areas of the nozzles constituting a means for regulating the pressure downstream of the containers;

the means for regulating the pressure of the treatment gas upstream of the containers comprise a pressure reducer inserted between a source supplying treatment gas and the inlet to the containers;

it comprises a pipe running between the inlet and the outlet of the containers and equipped with a passage the internal cross section of which is designed to keep the flow rate of treatment gas in the ejector approximately constant when the number of containers varies; and it further comprises an upstream-pressure regulator connected to the outlet of the ejector.

Another subject of the invention is an apparatus for storing silicon wafers, comprising a collection of containers for storing the wafers away from the ambient air, characterized in that this apparatus is equipped with a device for treating items as defined hereinabove with a view to treating the wafers, the treatment gas comprising an inert gas, particularly nitrogen or argon, or consisting of purified air.

Another subject of the invention is a method for treating items stored in containers by means of a treatment device as defined hereinabove, the method consisting in supplying the containers with a treatment gas and in continuously purging the containers so as to cause the treatment gas to flow through them, characterized in that the circulation of treatment gas is obtained by regulating the pressure of the treatment gas upstream of the containers, by supplying a gas ejector connected to the outlet of the containers with a drive gas and by regulating at least one parameter chosen from the flow rate and the pressure of the drive gas so as to regulate the pressure of the said treatment gas downstream of the containers and thus control the flow rate of the said treatment gas therein.

According to a particular feature of this method, since the gas mixture leaving the ejector is intended to be discharged into the ambient air, the ratio between the passage areas of coaxial nozzles—an external one and an internal one—of the ejector, which nozzles are supplied respectively with a treatment gas and with a drive gas, are determined as a function of a maximum ratio between the flow rates of the treatment gas and of the drive gas which corresponds to a maximum treatment gas content leaving the ejector and as a function of the ratio between the pressure of the treatment gas downstream of the containers and the pressure of the drive gas.

As an alternative, since the ejector is intended to be connected, at outlet, to a pipe for extracting the treatment gas, the ratio between the passage areas of coaxial nozzles—an external one and an internal one—of the ejector, which nozzles are supplied respectively with a treatment gas and with a drive gas, are determined as a function of the maximum ratio between the pressure of the gas mixture leaving the ejector and the pressure of the treatment gas, and the minimum ratio between the flow rates of the treatment gas and of the drive gas is determined as a function of the said pressure ratio.

BRIEF DESCRIPTION OF THE FIGURES OF THE DRAWING

Other features and advantages will emerge from the description which follows, given merely by way of example and made with reference to the appended drawings, in which:

FIG. 1 diagrammatically depicts a device, denoted by the general numerical reference 10, for treating items stored in containers.

Figure 1:
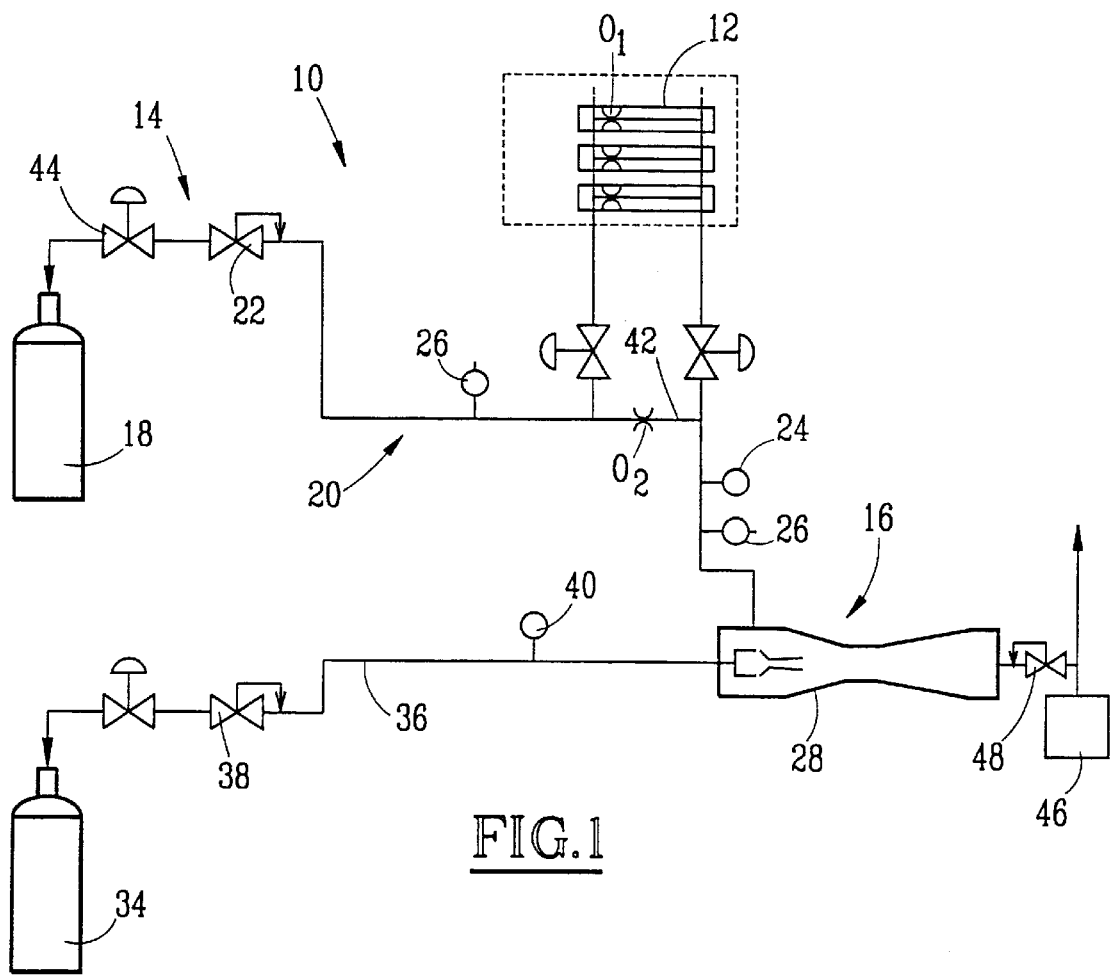
FIG. 1 depicts a device for storing silicon wafers according to the invention.

The containers 12 are made of a plastic, for example of a polycarbonate.

The treatment consists in causing a stream of treatment gas to flow through the containers 12.

A particularly beneficial application of this device is the treating of silicon wafers stored in containers 12 when these wafers are awaiting production cycles.

For this application, to treat the silicon wafers, a stream of inert gas capable of inerting the inside of the containers is caused to flow through the containers 12, constantly eliminating the formation of the native oxide caused by the presence of water or oxygen molecules near the surface of the wafers.

To do this, the device 10 comprises means 14 for supplying the containers with treatment gas and means 16 for constantly purging the containers.

The supply means 14 comprise a source 18 of treatment gas, consisting of an inert gas such as nitrogen, argon, or purified air for treating items which are not sensitive to oxygen, the treatment gas being free of contamination with particles or with $H_2O$.

In the example depicted in FIG. 1, which illustrates a particularly suitable embodiment for a device arranged in the form of a portable item of apparatus, the source 18 consists of a cylinder of compressed gas.

Of course, as an alternative, and as will be described with reference to FIG. 4, the source of treatment gas may consist of the outlet of a fixed pipeline supplying treatment gas.

The source 18 is connected, at outlet, to a pipe 20 for supplying the containers 12, which pipe is fitted with a pressure reducer 22 for regulating the pressure of the treatment gas upstream of the containers.

Means for measuring the differential pressure and flow rate of the treatment gas, these means being denoted by the numerical references 24 and 26, are fitted to the pipe 20.

The purge means 16 for their part comprise a gas ejector 28 connected at outlet to the containers 12 and regulating the pressure of the treatment gas downstream of these containers, so as, via the hydraulic conductance of the containers, to control the flow rate of this gas through these containers.

Figure 2:
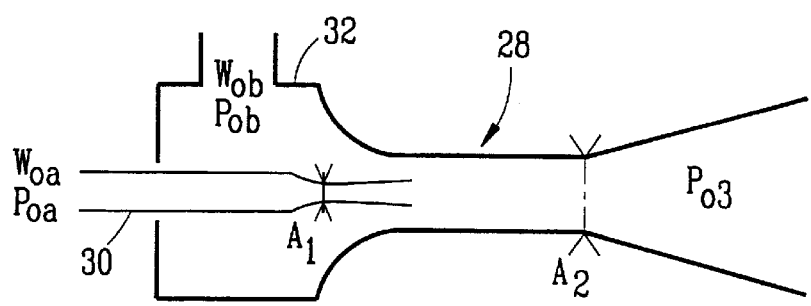
FIG. 2 is a view of a gas ejector used in the device of FIG. 1.

Referring also to FIG. 2, the gas ejector 28 comprises two coaxial nozzles 30 and 32—an internal one and an external one, respectively.

The external nozzle 32 is connected to the outlet of the containers 12, while the internal nozzle 30 is supplied with a drive gas delivered by a gas supply source 34.

In the embodiment depicted in FIG. 1, the drive gas supply source 34 consists of a cylinder of compressed gas connected to the internal nozzle 30 by means of a supply pipe 36. The latter is fitted with a pressure reducer 38 regulating the pressure of the drive gas in the pipe 36, and with a member 40 for measuring the pressure in the pipe 36.

The source of drive gas may, however, consist of the outlet of a corresponding supply pipeline, as will be described with reference to FIG. 4.

The drive gas may consist of any type of gas appropriate for the envisaged use. However, as a preference, air or oxygen is preferred so as to allow, as will be mentioned hereinafter, the gas mixture leaving the ejector 28 to be discharged to the atmosphere, lowering the treatment gas content to a value below a maximum permissible value by diluting this treatment gas with drive gas.

Thus, for example, if the treatment gas is sufficiently diluted with such a drive gas, the mixture becomes breathable.

Each container 12 is characterized by its hydraulic conductance, depicted diagrammatically by a calibrated orifice $0_1$, which conductance is used to reliably and independently regulate the flow rate in each of the containers and make the flow rate therein dependent only on the pressure upstream and downstream of the containers. As an alternative, a calibrated orifice may be provided at the inlet to each container.

The device If is also provided with a pipe 42 stretching between he inlet and the outlet of the containers, this pipe being equipped with a passage $0_2$ the internal cross section of which is designed to keep the flow rate of treatment gas through the ejector approximately constant regardless of the number of containers and, in particular, to ensure a constant flow rate of treatment gas through the pipes, even when there are no containers, so as to avoid any risk of contamination of the pipes of the device 10.

The device is supplemented by a collection of valves, such as 44, allowing the flow of the drive gas and treatment gas in the pipes 20 and 36 to be controlled, and by a unit 46 for analyzing the gas mixture leaving the ejector 28.

Furthermore, it is possible to equip the device with one or more particulate filters (not depicted) downstream of the pressure reducer 22, to avoid any contamination of the containers.

The treatment device which has just been described operates as follows.

Once the valves 44 have been opened, the treatment gas and the drive gas flow through the supply pipes 20 and 36 respectively.

Under the action of the pressure reducer 22 with which the pipe 20 for supplying the containers 12 with treatment gas is equipped, the pressure of this treatment gas upstream of the containers 12 is regulated to a predetermined value.

The drive gas, for its part, supplied to the internal nozzle 30 of the ejector 28, causes treatment gas to be drawn in.

More specifically, and as will be described with reference to FIG. 3, the static and dynamic characteristics of the flow of drive gas through the internal nozzle 30, namely the pressure and flow rate of the gas, and the ratio between the passage areas A2 and A1 of the external nozzle 32 and of the internal nozzle 30, respectively, allow the static and dynamic characteristics of the flow of treatment gas downstream of the containers 12 to be regulated.

Specifically, by regulating the pressure and/or the flow rate of the drive gas through the internal nozzle 30, the pressure of the treatment gas downstream of the containers is regulated and the flow rate of the treatment gas therein is thus controlled.

Likewise, in doing so, the concentration of treatment gas leaving the ejector 28 is determined.

The method for determining the static and dynamic characteristics of the flows of treatment gas and of drive gas, and the characteristics of the ejector, and the treatment gas content of the gas mixture leaving the ejector 28 will now be described with reference to FIG. 3.

In the remainder of the description, it will be considered that the treatment gas consists of nitrogen, and that the drive gas consists of air.

It will also be considered, for example, that the flow rate $W_{ob}$ of treatment gas to be obtained, which is a function of the number of containers, is 35 normal liters per minute and that the pressure $P_{ob}$ to be obtained downstream of the containers is 1000 millibar absolute.

As mentioned earlier, in the embodiment depicted in FIGS. 1 and 2, the installation 10 preferably constitutes a portable system incorporating the sources 18 and 34 for supplying treatment gas and drive gas, the ejector 28 associated with the analysis unit 46 and the various supply pipes 20 and 36 equipped with their pressure-regulating means.

According to this embodiment, the ejector outlet is intended to be placed in communication with the ambient air, for example the air of a clean room, in which the containers 12 for storing silicon wafers are housed.

In order to avoid any contamination of the atmosphere of the clean room, and particularly any risk of asphyxia to the operators, the outlet of the ejector has to discharge a gas mixture containing a minimum oxygen content fixed, for example, at 18%.

The minimum oxygen content dictates a minimum ratio between the flow rate $W_{ob}$ of the treatment gas and the flow rate $W_{oa}$ of he drive gas, fixed at 0.164.

Figure 3:
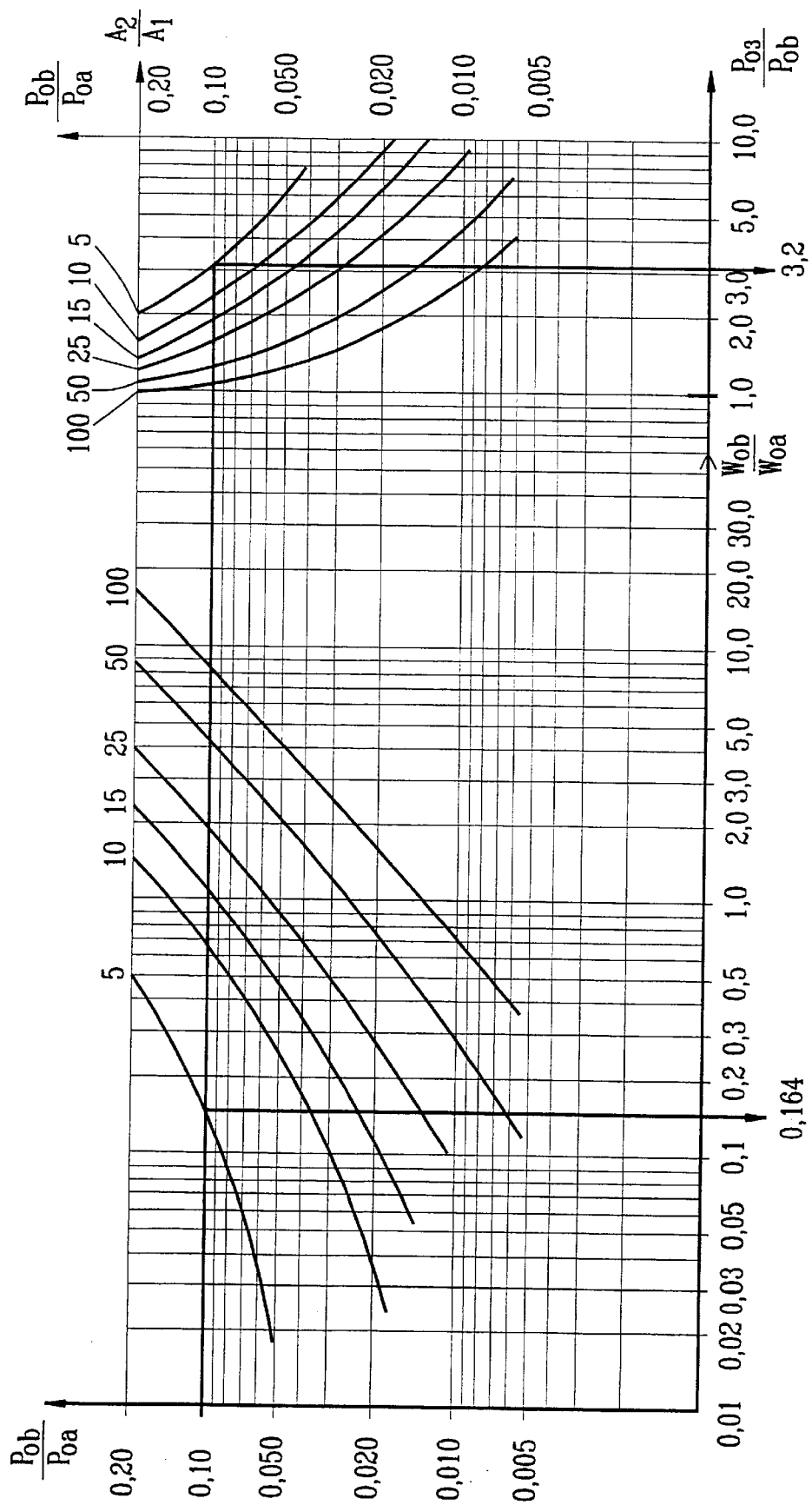
FIG. 3 shows a graph which allows static and dynamic parameters of the flow of treatment gas and the geometric characteristics of the ejector of FIG. 2 to be determined.

As can be seen in FIG. 3, this minimum ratio corresponds to a ratio between the pressure $P_{ob}$ of the treatment gas downstream of the containers and the pressure $P_{oa}$ of the drive gas equal to 0.10 for a ratio A2/A1 between the passage areas of the external and internal nozzles of 5.

Thus, to obtain the desired value for the flow rate $W_{ob}$ of treatment gas through the containers, the flow rate $W_{oa}$ of drive gas has to be regulated to a value at least equal to about 213 normal liters per minute.

Likewise, the pressure $P_{oa}$ of drive gas has to be regulated to a value at most equal to 10 bar absolute.

It will be noted that these conditions correspond to a ratio between the pressure $P_{o3}$ downstream of the ejector and the pressure $P_{ob}$ of the treatment gas at least equal to 3.2.

In consequence, the pressure $P_{o3}$ downstream of the ejector is at least equal to 3.2 bar absolute.

As the outlet of the ejector 28 is intended to be placed in communication with the ambient air, the ejector outlet is equipped with an upstream-pressure regulator 48 for regulating the pressure $P_{o3}$ to this minimum pressure value.

It will thus be understood that the treatment device which has just been described makes it possible, from regulating the static and dynamic parameters of the flow of drive gas and from the choice of passage areas for the internal nozzle 30 and external nozzle 28, to control, firstly, the corresponding static and dynamic parameters of the flow of treatment gas through the containers 12 and, secondly, the concentration of treatment gas leaving the ejector 28, so as to prevent any risk of asphyxia to the operators.

As mentioned earlier, it will be noted that the device 10 described with reference to FIG. 1 is particularly suited to forming a portable treatment installation.

Figure 4:
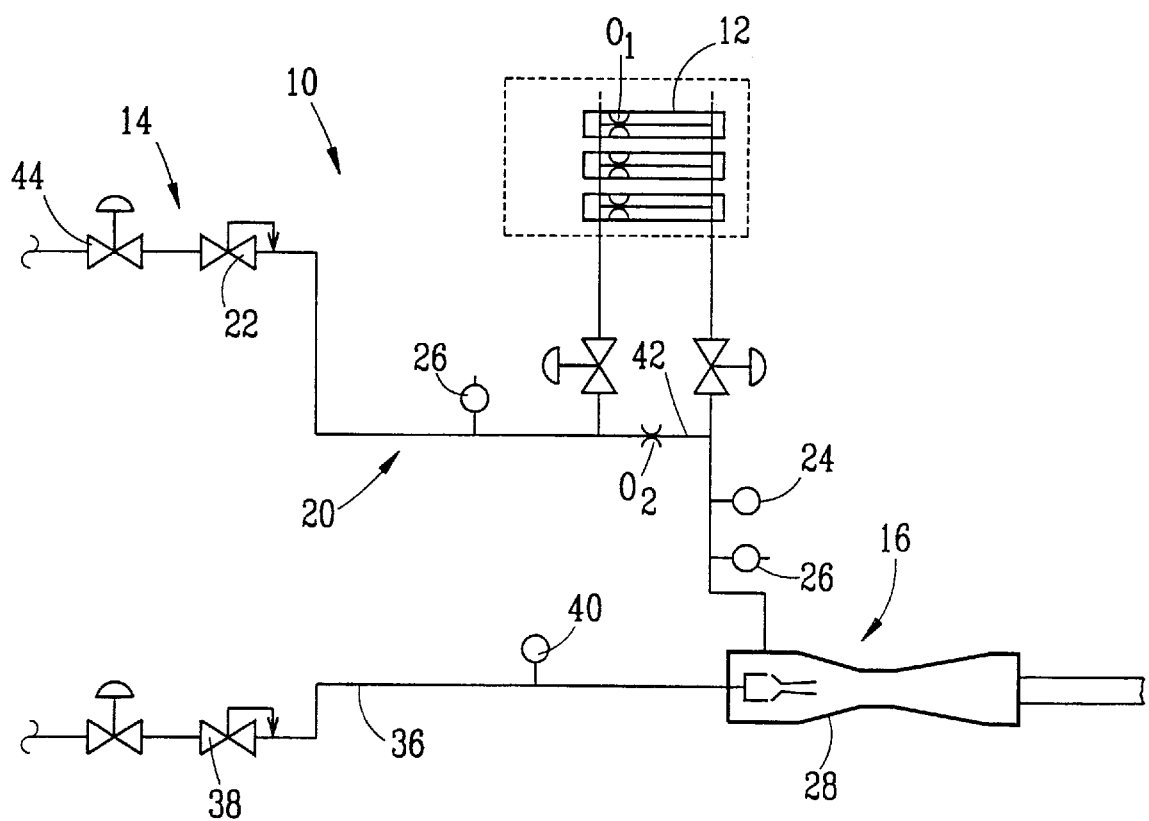
FIG. 4 depicts another embodiment of the treatment device of FIG. 1.

As can be seen in FIG. 4, it is also possible to configure this device in the form of a fixed installation connected, on the one hand, to a pipeline supplying treatment gas and drive gas and, on the other hand, connecting at the outlet of the ejector 28, to a pipe for extracting treatment gas.

It will thus be understood that, for such an application, the treatment gas content at the outlet of the ejector 28 is not a major parameter although the maximum treatment gas content at the ejector outlet is, as far as possible, preferably regulated to a value which avoids any risk of contaminating the ambient air in the event of a leak in the extraction pipe.

However, the pressure $P_{o3}$ downstream of the ejector must necessarily be limited to a maximum permissible value for the extraction pipe.

To do this, the ratio A2/A1 between the inside diameters of the external and internal nozzles of the ejector is determiner as a function of the maximum value of the pressure $P_{o3}$ of the gas mixture leaving the ejector.

Thus, on the basis of the value of the pressure $P_{ob}$ of the treatment gas to be obtained downstream of the containers to regulate the flow rate through the containers, and of the maximum pressure $P_{o3}$ downstream of the ejector, the maximum ratio $P_{o3}/P_{ob}$ of the pressures is determined.

Then, using the graph depicted in FIG. 3, the maximum ratio A2/A1 between the passage areas of the external and internal nozzles of the ejector corresponding to this maximum pressure ratio is chosen.

Next, firstly the ratio between the pressure of the treatment gas downstream of the containers and the pressure of the drive gas, and secondly, the ratio between the flow rate of treatment gas and the flow rate of drive gas, corresponding to the ratio of the chosen passage areas, is chosen.

The value of the pressure $P_{oa}$ and of the flow rate $W_{oa}$ of the drive gas supplied to the nozzle and which sets the pressure and flow rate of the treatment gas to be obtained in the containers is thus determined.

It will be understood that the invention which has just been described employs means based on mechanical elements for controlling and regulating the pressure and flow rate of the treatment gas, These elements are therefore not likely to generate fluctuations or drifts over time n the value of the pressure imposed upstream and downstream of the containers, and therefore allow reliable and durable regulation of the flow rate of treatment gas through the containers.

They also make it possible to avoid any overpressure or underpressure in the containers which is likely to cause an explosion or an implosion in so far as variations in he pressure in the clean room or variations in atmospheric pressure can be compensated for.

What is claimed is:

1. Device for treating items stored in at least one container, comprising means for supplying the containers with a treatment gas and means for continuously purging the containers, the supply means being equipped with means for regulating the pressure of the treatment gas upstream of the containers, the purging means comprising a gas ejector connected to the outlet of the containers and supplied with a drive gas to regulate the pressure of the treatment gas downstream of the containers and thus control the flow rate of the treatment gas therein, wherein the gas ejector comprises two coaxial nozzles, an internal one and an external one, supplied respectively with drive gas and treatment gas, the ratio of the passage areas of the nozzles constituting a means for regulating the pressure downstream of the containers.

2. Device according to claim 1, characterized in that the gas ejector (28) constitutes a means for diluting the treatment gas, the flow rate of drive gas constituting a means of controlling the treatment gas content of the gas mixture leaving the ejector (28).

3. Device according to of claim 1, characterized in that the means for regulating the pressure of the treatment gas upstream of the containers comprise a pressure reducer (22) inserted between a source (18) supplying treatment gas and the inlet to the containers (12).

4. Device according to of claim 1, characterized in that it comprises a pipe (42) running between the inlet and the outlet of the containers and equipped with a passage ($0_2$) the internal cross section of which is designed to keep the flow rate of treatment gas in the ejector approximately constant when the number of containers varies.

5. Device according to claim 1, which further comprises a pressure regulator connected to the outlet of the ejector.

6. Device according to claim 1, wherein the treatment gas and drive gas leaving the ejector are discharged into the ambient air, the ratio between the passage areas (A1, A2) of coaxial nozzles—an external one and an internal one—of the ejector, which nozzles are supplied respectively with treatment gas and drive gas, are determined as a function of a ratio between the flow rates of the treatment gas and the drive gas which corresponds to a treatment gas content leaving the ejector and as a function of the ratio between the pressure of the treatment gas downstream of the containers and the pressure of the drive gas.

7. Device according to claim 1, wherein the ejector is connected at an outlet to a pipe for extracting the treatment gas, the ratio between the passage areas of coaxial nozzles—an external one and an internal one—of the ejector, which nozzles are supplied respectively with treatment gas and drive gas, are determined as a function of the ratio between the pressure of the gas mixture leaving the ejector and the pressure of the treatment gas, and the ratio between the flow rates of the treatment gas and the drive gas is determined as a fiction of the said pressure ratio.

8. Device according to claim 2, characterized in that the means for regulating the pressure of the treatment gas upstream of the containers comprise a pressure reducer (22) inserted between a source (18) supplying treatment gas and the inlet to the containers (12).

9. Device according to claim 2, characterized in that it comprises a pipe (42) running between the inlet and the outlet of the containers and equipped with a passage ($0_2$) the internal cross section of which is designed to keep the flow rate of treatment gas in the ejector approximately constant when the number of containers varies.

10. Device according to claim 2, which further comprises a pressure regulator connected to the outlet of the ejector.

11. Apparatus for storing silicon wafers, comprising a collection of containers for storing the wafers away from the ambient air, wherein this apparatus is equipped with a device for treating items according to claim 2, with a view to treating the wafers, the treatment gas comprising an inert gas or consisting of purified air.

12. A device according to claim 1, wherein the treatment gas comprises an inert gas or purified air.

13. Apparatus for storing silicon wafers, comprising a collection of containers for storing the wafers away from the ambient air, the apparatus equipped with a device for treating the wafers with a gas, the treatment gas comprising an inert gas or consisting of purified air, said device comprising means for supplying the containers with a treatment gas and means for continuously purging the containers, the supply means being equipped with means for regulating the pressure of the treatment gas upstream of the containers, the purging means comprising a gas ejector connected to the outlet of the containers and supplied with a drive gas to regulate the pressure of the treatment gas downstream of the containers and thus control the flow rate of the treatment gas therein.

14. An apparatus according to claim 13, wherein the treatment gas comprises nitrogen or argon.

15. An apparatus according to claim 13, wherein the treatment gas and drive gas leaving the ejector are discharged into the ambient air, the ratio between the passage areas (A1, A2) of coaxial nozzles—an external one and an in one—of the ejector, which nozzles are supplied respectively with treatment gas and drive gas, are determined as a function of a ratio between the flow rates of the treatment gas and the drive gas which corresponds to a treatment gas content leaving the ejector and as a function of the ratio between the pressure of the treatment gas downstream of the containers and the pressure of the drive gas.

16. An apparatus according to claim 13, wherein the ejector is connected at an outlet to a pipe for extracting the treatment gas, the ratio between the passage areas of coaxial nozzles—an external one and an internal one—of the ejector, which nozzles are supplied respectively with a treatment gas and with a drive gas, are determined as a function of the ratio between be pressure of the gas mixture leaving the ejector and the pressure of the treatment gas, and the ratio between the flow rates of the treatment gas and the drive gas is determined as a function of de said pressure ratio.

* * * * *